(12) United States Patent
Wang et al.

(10) Patent No.: US 7,286,584 B2
(45) Date of Patent: Oct. 23, 2007

(54) CARRIER BONDED 1550 NM VCSEL WITH INP SUBSTRATE REMOVAL

(75) Inventors: Tzu-Yu Wang, Maple Grove, MN (US); Jin K. Kim, St. Louis Park, MN (US); Hoki Kwon, Plymouth, MN (US); Gyoungwon Park, Allentown, PA (US); Jae-Hyun Ryou, Maple Grove, MN (US)

(73) Assignee: Finisar Corporation, Sunnyvale, CA (US)

( * ) Notice: Subject to any disclaimer, the term of this patent is extended or adjusted under 35 U.S.C. 154(b) by 197 days.

(21) Appl. No.: 11/007,081

(22) Filed: Dec. 8, 2004

(65) Prior Publication Data

US 2005/0243886 A1 Nov. 3, 2005

Related U.S. Application Data

(60) Provisional application No. 60/566,744, filed on Apr. 30, 2004.

(51) Int. Cl.
*H01S 5/00* (2006.01)
(52) U.S. Cl. .................. 372/43.01; 372/50.11
(58) Field of Classification Search ............. 372/43.01, 372/50.11

See application file for complete search history.

(56) References Cited

U.S. PATENT DOCUMENTS 6,362,069 B1 * 3/2002 Forrest et al. .............. 438/401
6,549,556 B1 * 4/2003 Hwang et al. ................ 372/96

OTHER PUBLICATIONS

Koley, et al., *Dependence of Lateral Oxidation Rate on Thickness of AlAs layer of Interest as a Current Aperture in Vertical-Cavity Surface-Emitting Laser Structures*, Journal of Applied Physics, vol. 84, No. 1, Jul. 1, 1998, pp. 600-605.
Osinski, et al., *Temperature and Thickness Dependence of Steam Oxidation of AlAs in Cylindrical Mesa Structures*, IEEE Photonics Technology Letters, vol. 13, No. 7, Jul. 2001, pp. 687-689.
Choe, et al., *Lateral Oxidation of AlAs layers at Elevated Water Vapour Pressure Using a Closed-Chamber System*, Semiconductor Science Technology, vol. 15, Aug. 1, 2000, pp. L35-L38.
Tao, et al., *Wet-Oxidation of Digitally Alloyed AlGaAs*, National Nanofabrication Users Network, pp. 74-75.

* cited by examiner

*Primary Examiner*—Dung (Michael) T. Nguyen
(74) *Attorney, Agent, or Firm*—Workman Nydegger

(57) ABSTRACT

A vertical cavity surface emitting laser (VCSEL) structure includes a bottom distributed Bragg reflector (DBR) arranged over a substrate; a metal layer interposed between the bottom DBR and the substrate, wherein the metal layer and bottom DBR form a composite mirror structure. A patterned dielectric layer may be interposed between the metal layer and the bottom DBR to reduce a deleterious chemical reaction between the metal layer and the bottom DBR. The metal layer directly contacts a portion of the bottom DBR to enhance the electrical and thermal conductivity of the VCSEL structure.

13 Claims, 6 Drawing Sheets

US 7,286,584 B2

CARRIER BONDED 1550 NM VCSEL WITH InP SUBSTRATE REMOVAL

CROSS-REFERENCE TO RELATED APPLICATIONS

This application claims the benefit of U.S. Provisional Application No. 60/566,744, filed Apr. 30, 2004 and entitled CARRIER BONDED 1550 nm VCSEL WITH InP SUBSTRATE REMOVAL, which is hereby incorporated by reference.

BACKGROUND OF THE INVENTION

1. Field of the Invention

The present invention relates to generally to electromagnetic laser radiation by semiconductor lasers and, in particular, to vertical cavity surface emitting lasers (VCSELs) and methods for fabricating the same.

2. Description of the Related Art

Lasers have a wide range of industrial and scientific uses. There are several types of lasers, including gas lasers, solid-state lasers, liquid (dye) lasers, and free electron lasers. Semiconductor lasers are also in use. In semiconductor lasers, electromagnetic waves are amplified in a semiconductor superlattice structure. Semiconductor lasers may be diode lasers (bipolar) or non-diode lasers such as quantum cascade (QC) lasers (unipolar). Semiconductor lasers are used for a variety of applications and can be built with different structures and semiconductor materials, such as gallium arsenide (GaAs).

The use of semiconductor lasers for forming a source of optical energy is attractive for a number of reasons. Semiconductor lasers have a relatively small volume and consume a small amount of power as compared to conventional laser devices. Further, semiconductor lasers can be fabricated as monolithic devices, which do not require a combination of a resonant cavity with external mirrors and other structures to generate a coherent output laser beam.

A semiconductor laser typically comprises an active (optical gain) region sandwiched between two mirrors, one of which serves as the "exit" mirror. When the active region is pumped with an appropriate pumping energy, it produces photons, some of which resonate and build up to form coherent light in a resonant cavity within the active region between the two mirrors. A portion of the coherent light built up in the resonant cavity passes through the exit mirror as the output laser beam.

Various forms of pumping energy may cause the active region to begin to emit photons. For example, semiconductor lasers of various types may be electrically pumped (EP) via a DC or alternating current, optically pumped, etc. EP semiconductor lasers are typically powered by applying an electrical potential difference across the active region, which causes current to flow therein. As a result of the applied potential, charge carriers (electrons and holes) are injected from opposite directions into the active region where recombination of electrons and holes occurs. Within the active region, two types of recombination events can occur simultaneously: radiative and non-radiative. When radiative recombination occurs, a photon is emitted with the same energy as the difference in energy between the hole and electron energy states. Some of those photons travel in a direction perpendicular to the mirrors of the laser. As a result of ensuing reflections between the two mirrors, the photons can travel through the active region multiple times.

Stimulated emission occurs when radiative recombination of an electron-hole pair is stimulated by interaction with a photon. Particularly, stimulated emission occurs when a photon with an energy equal to the difference between an electron's energy and a lower energy interacts with the electron. In this case, the photon stimulates the electron to fall into the lower energy state, thereby emitting a second photon. The second photon will have the same energy and frequency as the original photon. Thus, when the photons produced by spontaneous electron emission interact with other high energy state electrons, stimulated emission can occur so that two photons with identical characteristics are present. If a sufficient amount of radiative recombinations are stimulated by photons, the number of photons traveling between the mirrors tends to increase, giving rise to amplification of light and lasing. The result is that coherent light builds up in the resonant cavity formed by the two mirrors, a portion of which passes though the exit mirror as the output laser beam.

Semiconductor lasers may be classified as edge-emitting lasers or surface-emitting lasers (SELs). Edge-emitting semiconductor lasers output their radiation parallel to the substrate surface while SELs output their radiation perpendicular to the substrate surface. One type of SEL is the vertical-cavity surface-emitting laser (VCSEL). The "vertical" direction in a VCSEL is the direction perpendicular to the plane of the substrate on which the constituent layers are deposited or epitaxially grown, with "up" being typically defined as the direction of deposition or growth. In some designs, the laser beam is emitted from the top side, in which case the upper of the two mirrors is the exit mirror. The exit mirror typically has a slightly lower reflectance, i.e., reflectivity, than the other, non-exit mirror.

VCSELs have many attractive features compared to edge-emitting lasers, such as low threshold current, single longitudinal mode, a circular output beam profile, and scalability to monolithic laser arrays. VCSELs have a shorter resonant cavity than edge-emitting lasers and thus have better longitudinal mode selectivity and narrower linewidths. Additionally, because the output is perpendicular to the substrate surface, it is possible to test fabricated VCSELs on the surface before extensive packaging must be done, in contrast to edge-emitting lasers, which must be cut from the wafer to test the laser. Also, because the cavity resonator of the VCSEL is perpendicular to the layers, there is no need for cleaving operations common to edge-emitting lasers.

The VCSEL structure usually consists of an active region sandwiched between upper and lower mirrors such as distributed Bragg reflectors (DBRs), i.e., top and bottom DBRs, respectively. Because the optical gain is low in a vertical cavity design, the DBRs require a high reflectance in order to achieve sufficient level of feedback for the device to lase. DBRs are typically formed of multiple pairs of layers referred to as mirror pairs. DBR mirrors of a typical VCSEL can be constructed from dielectric (insulating) layers, semiconductor layers, or a combination thereof including metal layers. The pairs of layers are formed of a material system generally consisting of two materials having different indices of refraction; for semiconductor DBRs, the layers are typically selected so that they are easily lattice matched to other structures of the VCSEL, to permit epitaxial fabrication techniques.

When properly designed, mirror pairs will cause a desired reflectance at the lasing wavelength, at which wavelength the active region is also designed to have sufficient gain to permit lasing to occur. Typically in a VCSEL, the mirrors are designed so that the bottom DBR (i.e., the DBR interposed between the substrate material and the active region) has nearly 100% reflectance, while the top (exit) DBR has a reflectance that may be 98%-99.5% (depending on the details of the laser design). The partially reflective top (exit) mirror passes a portion of the coherent light built up in the resonating cavity formed by the active region and top and bottom mirrors.

For semiconductor DBRs, the number of mirror pairs per stack may range from 20-50 pairs to achieve a high reflectance, depending on the difference between the refractive indicies of the layers. As the number of mirror pairs increases, the percentage of reflected light increases. The difference between the refractive indices of the layers of the mirror pairs can be higher in dielectric DBRs, generally imparting higher reflectance to dielectric DBRs than to semiconductor DBRs for the same number of mirror pairs and overall thickness. Conversely, in dielectric DBRs, a smaller number of mirror pairs can achieve the same reflectance as a larger number of mirror pairs in semiconductor DBRs. However, despite their lower reflectance/greater thickness, semiconductor DBRs can be preferred because of comparative advantages in electrical conductivity, thermal conductivity, and manufacturability. For example, in an EP VCSEL, semiconductor DBRs are preferred, especially as bottom DBRs (between the substrate and active region), to conduct electrical current through the active region, the bottom DBR, and into the substrate. Accordingly, there is often a tradeoff between using a lower reflectance, thicker semiconductor DBR, or a higher reflectance, thinner dielectric DBR which is more difficult to manufacture or which makes thermal conductivity more of an issue.

While generally successful, VCSELs have problems. For example, a major problem in realizing commercial quality long wavelength VCSELs (e.g., VCSELs lasing at wavelengths longer than 1000 nm such as 1300 nm to 1550 nm) is the available mirror materials. Long wavelength VCSELs are of great interest in the optical telecommunications industry because of minimum dispersion in fibers at 1320 nm and minimum loss in fibers at 1550 nm. Long wavelength VCSELs are often based on InP material systems. For proper lattice matching, an InP-based VCSEL usually uses InP/InGaAsP or AlInAs/AlInGaAs DBRs. However, because those materials have relatively small differences in refractive indicies, an unacceptable number of mirror pairs (e.g., 40-50) are typically needed to achieve the required reflectance. Growing that number of mirror pairs takes a long time, which increases the production costs. Moreover, as the operating (emitting) wavelength of the laser increases, the thickness of each layer within the mirror pair must also increase, further contributing to the increased thickness of long-wavelength semiconductor DBRs.

Long-wavelength VCSELs thus would require a comparatively thick semiconductor bottom DBR, which can be difficult to manufacture. Such thick DBRs can also have poor thermal conductivity, so that it is difficult to achieve adequate heat dispersion to the heat-spreading submount to which the bottom DBR is mounted. The formation of the thick semiconductor DBR on an InP substrate, for example, causes serious manufacturability problems, as described above.

Many attempts have been made to address this problem, including fabrication of devices via wafer bonding techniques, but only limited success has been achieved. As an example, VCSEL devices can be formed by independently growing a semiconductor DBR on a GaAs substrate and an active layer on an InP substrate. The two components are then flip-chip mounted together and fused using wafer fusion techinques. The process described above, however, yields a device that is expensive to manufacture and exhibits low efficiency, low output power, and low yield. In addition, the interface defect density in the wafer fusion procedure causes potential reliability problems of the VCSEL end product.

BRIEF SUMMARY OF THE INVENTION

Accordingly, the present invention is directed to a carrier bonded 1550 nm vertical cavity surface emitting laser with InP substrate removal that substantially obviates one or more of the problems due to limitations and disadvantages of the related art.

An advantage of the present invention provides a vertical cavity surface emitting laser (VCSEL) having high reflectivity and heat dissipation characteristics.

Another advantage of the present invention provides a VCSEL having a reduced number of semiconductor mirror pairs within a bottom distributed Bragg reflector (DBR).

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a vertical cavity surface emitting laser (VCSEL) structure may, for example, include a metal layer arranged on a carrier substrate; a dielectric layer arranged on the carrier substrate; a lower distributed Bragg reflector (DBR) arranged on the dielectric layer, wherein the lower DBR contacts a portion of the metal layer; and an active region arranged on the lower DBR.

In another aspect of the present invention, a method of forming a vertical cavity surface emitting layer (VCSEL) structure may, for example, include forming an etch stop layer on a growth substrate; forming an upper reflector component on the etch stop layer; forming and active region on the upper reflector component; forming a lower distributed Bragg reflector (DBR) on the active region; forming a dielectric layer on the lower DBR; forming a metal layer on the dielectric layer, wherein the metal layer contacts a portion of the metal layer; bonding the metal layer to a carrier substrate; and removing the growth substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to embodiments of the present invention, examples of which are illustrated in the accompanying drawings.

The principles of the present invention provide an improved high-reflectance bottom mirror structure of a VCSEL and method for fabricating same. For example, the present invention provides for a fabrication of a high-reflectance bottom VCSEL mirror comprising a plurality of semiconductor DBR mirror pairs composited with a metal mirror. In one aspect of the present invention, the metal mirror may have a high reflectance enabling fewer semiconductor DBR mirror pairs to be incorporated within the bottom mirror structure. Accordingly, the composite mirror structure may provide a high degree of reflectance of greater than about 99.8% or even 99.9%, improved device thermal conductivity, and reduced defect density.

Figure 1:
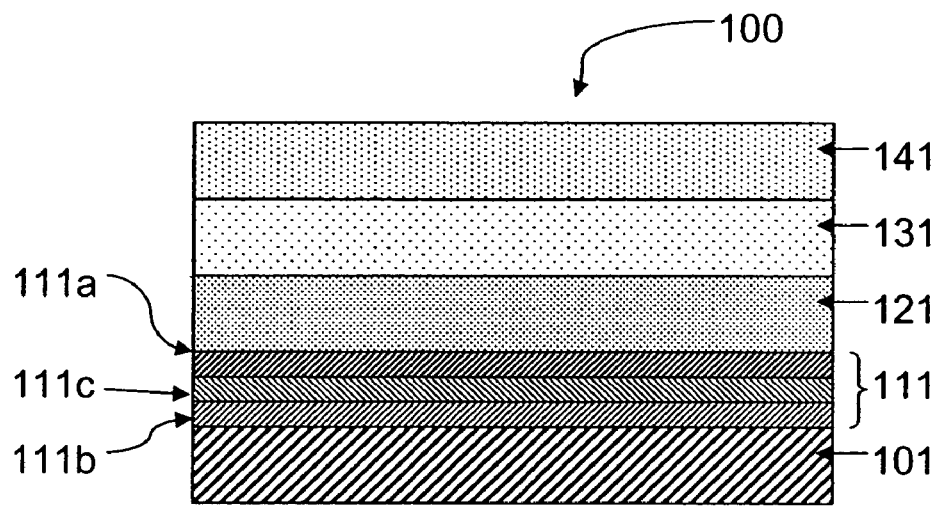
FIG. 1 illustrates a vertical cavity surface emitting laser (VCSEL) in accordance with principles of a first aspect of the present invention.

FIG. 1 illustrates a vertical cavity surface emitting laser (VCSEL) in accordance with principles of a first aspect of the present invention.

Referring to FIG. 1, a VCSEL structure 100 may, for example, include a carrier substrate 101, metal layer 111 arranged over the carrier substrate 101, a lower DBR 121 arranged over the metal layer 111, an active region 131 arranged over the lower DBR 121, and an upper reflector component 141 arranged over the active region 131.

According to principles of the present invention, the carrier substrate 101 may, for example, include a silicon (Si) substrate, gallium arsenide (GaAs) substrate, or the like. In one aspect of the present invention, the carrier substrate 101 may, for example, have a higher thermal conductivity than a growth substrate (not shown), which will be described in greater detail below.

The metal layer 111 may be formed of at least one metal sub-layer. In one aspect of the present invention, the metal layer 111 may, for example, include a first metal sub-layer 111a and, optionally, a second metal sub-layer 111b. The first metal sub-layer 111a (i.e., the metal mirror sub-layer) may include a metal having high electrical conductivity, high thermal conductivity, and high optical reflectance and the second metal sub-layer 111b (i.e., the metal bonding sub-layer) may include a metal having a relatively low melting temperature and capable of bonding. For example, the first metal sub-layer 111a may include a metal such as gold (Au), silver (Ag), copper (Cu), aluminum (Al), etc., or some alloy and/or layered combination thereof. Further, the second metal sub-layer 111b may, for example, include a metal such as gold (Au), silver (Ag), copper (Cu), aluminum (Al), indium (In), zinc (Zn), etc., or some alloy and/or layered combination thereof. It is beneficial that the melting temperature of the metal bonding layer be higher than temperatures at which subsequent device processing steps are performed to fabricate a VCSEL. In another aspect of the present invention, the metal layer 111 may further include a third metal sub-layer 111c arranged between first and second metal sub-layers 111a and 111b, wherein the third metal sub-layer 111c (i.e., the metal reaction barrier sub-layer) includes a metal having diffusion barrier CDZ yes properties. For example, the third metal sub-layer 111c may include a metal such titanium (Ti), tungsten (W), platinum (Pt), etc., or some alloy and/or layered combination thereof. In another aspect of the present invention, the metal layer 111 may include only the first metal sub-layer 111a. Accordingly, the material from which the first metal sub-layer 111a is formed may include substantially any metal suitable for use as a metal mirror sub-layer and a metal bonding sub-layer. In another aspect of the present invention, the total thickness of the metal layer III may be about 50 nm to about 100 nm. In yet another aspect of the present invention, the first metal sub-layer 111a may be formed to a thickness of, for example, about 300 to about 400 Å.

In one aspect of the present invention, the interface between the metal layer 111 and the lower DBR 121 may be substantially planar and continuous, with substantially no impurities formed therebetween.

The lower DBR 121 may, for example, include a plurality of alternating layers of AlPSb/GaPSb, etc. In one aspect of the present invention, the lower DBR 121 must have sufficient reflectance at the lasing wavelength of the VCSEL including the active region 131, to permit lasing to occur. Accordingly, the lower DBR 121 may be designed with an appropriate layer structure and material system and contain reflectance bands which include the lasing wavelength. In another aspect of the present invention, the term "DBR" may refer to any distributed reflector structure with at least two layers of varying or alternating refractive index giving rise to the necessary high-reflectance properties.

The active region 131 may, for example, include P-N junction structures and a large number of quantum wells (e.g., AlInGaAs, InGaAsP, InGaAs, GaAs, AlGaAs, InGaAsN, GaAsSb, (Al)GaInP, etc.).

The upper reflector component 141 may be provided as, for example, include a spacer layer, an upper DBR, or a combination thereof (wherein the spacer layer is disposed between the upper DBR and the active region 131. In one aspect of the present invention, the spacer layer may, for example, include a semiconductive material lattice matched to the active region 131. In another aspect of the present invention, the upper DBR may, for example, include a plurality of alternating layers of AlPSb/GaPSb, etc.

Figure 2A:
FIGS. 2A-2C illustrate an exemplary method by which the VCSEL shown in FIG. 1 is fabricated according to principles of the present invention.
Figure 2B:
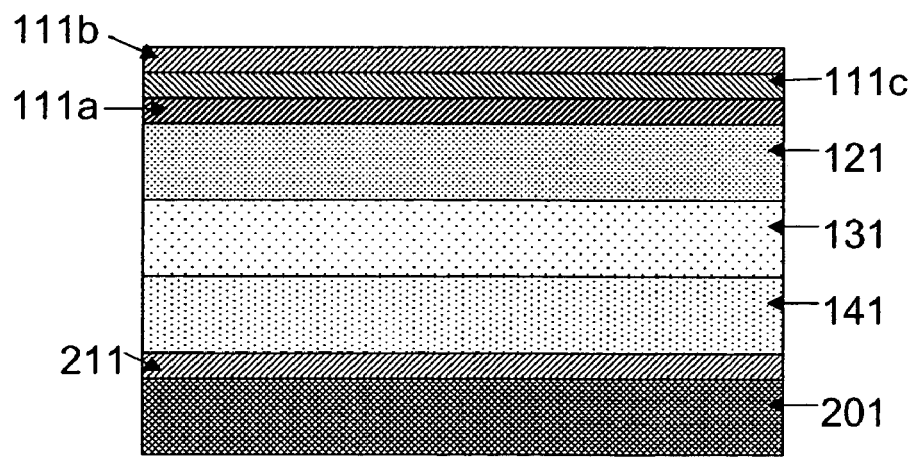
Figure 2C:
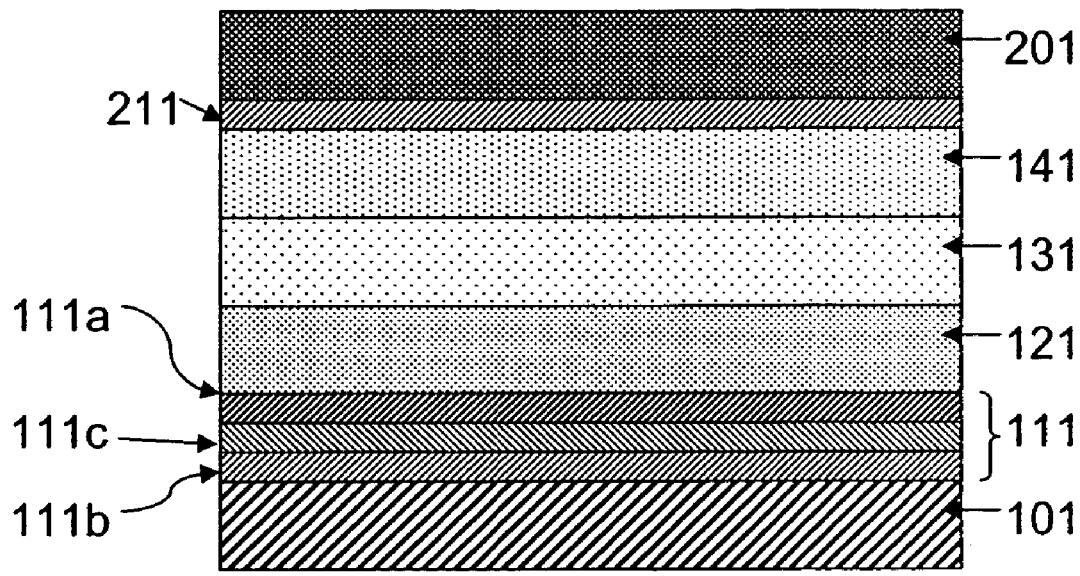

FIGS. 2A-2C illustrate an exemplary method by which the VCSEL structure shown in FIG. 1 is fabricated according to principles of the present invention.

Referring to FIG. 2A, a growth substrate 201 including a predetermined material system (e.g., InP, GaAs, GaN, GaSb, etc.) is provided. Subsequently, an etch stop layer 211 may be formed on the growth substrate 201 via any suitable method. According to principles of the present invention, the etch stop layer 211 may function in different ways depending on the process used to remove the growth substrate 201 from the layered stack shown in FIG. 2B, as will be discussed in greater detail below. In one aspect of the present invention, the etch stop layer 211 may include an As-based material having different etching characteristics from the growth substrate 201 (e.g., InGaAs, InGaAsP, InGaAlAs, etc.).

Referring to FIG. 2B, the various layers described above with respect to FIG. 1 may be formed on the etch stop layer 211 in the following order: upper reflector component 141, active region 131, lower DBR 121, first metal sub-layer 111a, third metal sub-layer 111c (optional), and second metal sub-layer 111b (optional).

Referring now to FIG. 2C, the layered stack, including the growth substrate 201, illustrated in FIG. 2B is attached to carrier substrate 101 via the metal layer 111. In one aspect of the present invention, the layered stack shown in FIG. 2B may be (attached to the carrier substrate 101 by applying heat, causing low melting temperature metals within the metal layer 111 to bond the layered stack formed on the growth substrate 201 to the carrier substrate 101. In one aspect of the present invention, the maximum bonding temperature necessary to effect suitable bonding of the components may depend on various factors. For example, the bonding temperature must be low enough such that the lower DBR 121, active region 131, and upper reflector component 141 are not significantly degraded, either optically or electrically. Further, the bonding temperature may also depend on the length of time required to fully bond the components. It will be appreciated that application of heat will planarize the surface of the metal layer that is to be bonded to the carrier substrate 101.

After the carrier substrate 101 is bonded to the metal layer 111, the growth substrate 201 may be removed from the layered stack shown in FIG. 2B. In a first aspect of the present invention, the growth substrate 201 may be removed upon providing the etch stop layer 211 to include a material that is substantially resistant to an etchants of the growth substrate 201. Accordingly, the growth substrate 201 may be removed by performing a first etching process to selectively etch the growth substrate 201 with respect to the etch stop layer 211, followed by a second etching process that etches away the etch stop layer 211 without significantly etching or damaging the upper reflector component 141. Alternatively, the etch stop layer may be retained for use as a bottom spacer, buffer layer, and the like. In a second aspect of the present invention, the growth substrate 201 may be removed upon providing the etch stop layer 211 to include a material that etches significantly faster than etchants of the growth substrate 201, thereby releasing the growth substrate 201 from the upper reflector component 141. Accordingly, after the growth substrate 201 has been removed from the layered stack shown in FIG. 2B, the VCSEL structure shown in FIG. 1 may be achieved. Further the VCSEL structure shown in FIG. 1 may be further processed as required (e.g., formation of reflective coatings, electrical contacts, current confinement structures, etc.) to fabricate substantially any desired VCSEL device. In one aspect of the present invention, if the upper reflector component 141 shown in FIG. 2B actually constitutes a spacer layer only, then subsequent processing may, for example, include formation of an upper DBR structure.

Functionally, the lower DBR 121 and the metal layer 111 form a composite mirror structure wherein constituent reflectance values of the lower DBR 121 and the portion of the metal layer 111 operably proximate the lower DBR 121 combine to provide a composite reflectance value. As will be appreciated, the composite reflectance value $R_c$ is a function of the reflectance values of the lower DBR 121 ($R_{DBR}$) and the metal layer 111 ($R_{ML}$) such that $R_c \approx R_{DBR}+((1-R_{DBR})*R_{ML})$. Accordingly, as the reflectance value of the metal layer 111 increases, the number of mirror pairs in the lower DBR 121 required to achieve a desired composite reflectance value decreases. For example, where the portion of the metal layer 111 operably proximate the lower DBR 121 includes any of the aforementioned metals suitable for functioning as a metal mirror sub-layer, a composite reflectance value of greater than about 99.8% (or even greater than about 99.9%) can be achieved while providing the lower DBR 121 with mirror pairs than lower DBRs of conventional VCSELs. Since the lower DBR 121 of the present invention includes significantly less mirror pairs than lower DBRs of conventional VCSELs, thereby providing a thinner VCSEL design with improved reflectance and higher thermal conductivity.

Figure 3:
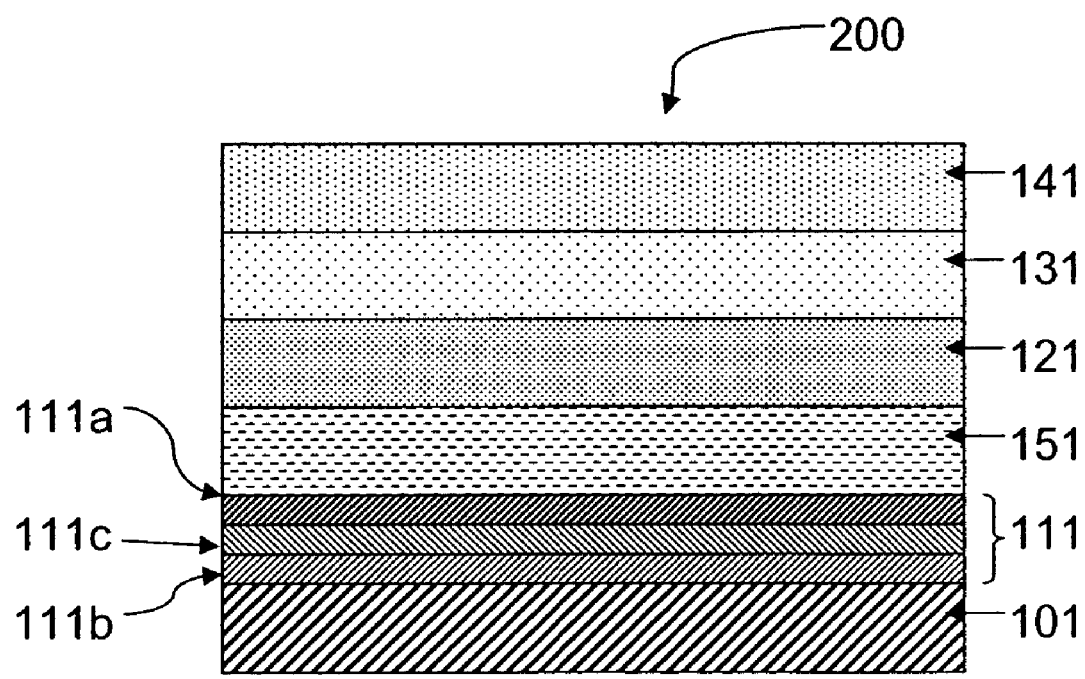
FIG. 3 illustrates a vertical cavity surface emitting laser (VCSEL) structure in accordance with principles of a second aspect of the present invention.

FIG. 3 illustrates a vertical cavity surface emitting laser (VCSEL) structure in accordance with principles of a second aspect of the present invention.

Depending on the reflectance properties of the metal layer 111, the phase of light reflected by the metal layer 111 may be shifted by as much as 90°. Therefore, a phase shift layer 151 may be interposed between the metal layer 111 and the lower DBR 121 to adjust the standing wave function, so that the phase of reflected light is phase matched at the lasing wavelength of the VCSEL to achieve maximum overall reflectance of the composite mirror structure. Accordingly, and while referring to FIG. 3, a VCSEL structure 200 may, for example, be fabricated in substantially the same manner as VCSEL structure 100, as shown in FIG. 1. Prior to forming the metal layer 111, however, the phase shift layer 151 may be formed on the lower DBR 121. In one aspect of the present invention, the phase shift layer 151 may, for example, be constructed of epitaxially grown semiconductor materials (e.g., α-Si, InP, etc.) or any other suitable dielectric material (e.g., $SiO_2$, $Al_2O_3$, etc.). In another aspect of the present invention, the phase shift layer 151 may be formed to a thickness and material suitable to achieve a desired degree of phase matching at a given lasing wavelength. For example, the phase shift layer 151 may be about 980 to about 1200 Å thick.

Figure 4:
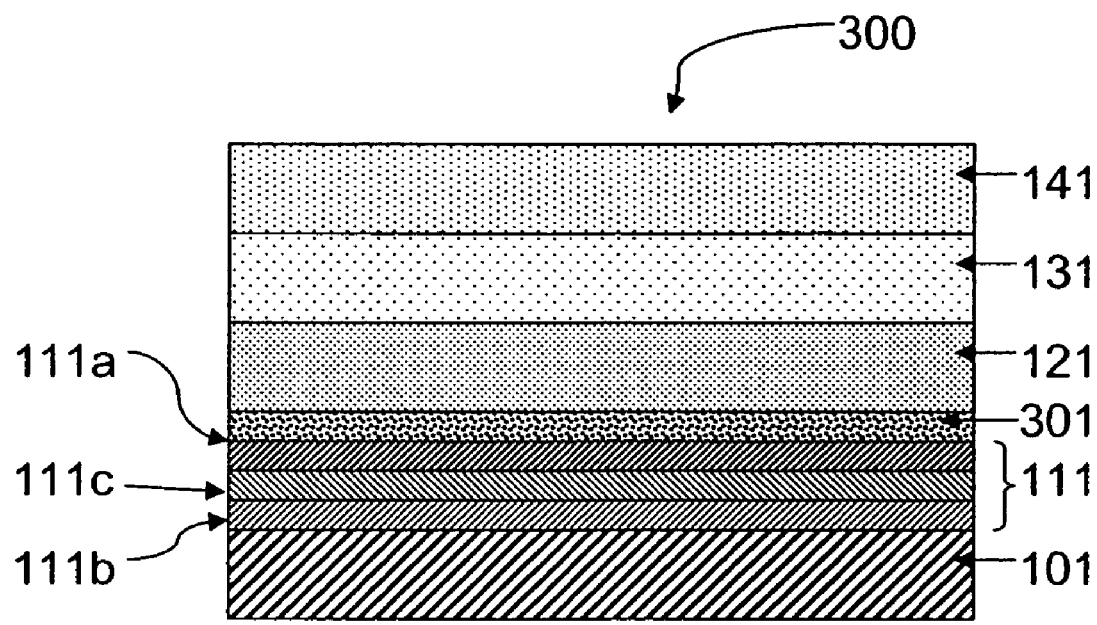
FIG. 4 illustrates a vertical cavity surface emitting laser (VCSEL) in accordance with principles of a third aspect of the present invention.

FIG. 4 illustrates a vertical cavity surface emitting laser (VCSEL) structure in accordance with principles of a third aspect of the present invention.

Referring to FIG. 4, a VCSEL structure 300 may, for example, be fabricated in substantially the same manner as VCSEL structure 100, shown in FIG. 1. Prior to forming the metal layer 111, however, a thin dielectric layer 301 may be formed on the lower DBR 121. In one aspect of the present invention, the dielectric layer may include organic or inorganic dielectric materials (e.g., $SiO_2$, $Al_2O_3$, etc.) and may have a thickness of less than or equal to about one-half of a lasing wavelength (e.g., about 100 to about 1000 Å). Further, it is beneficial that the dielectric layer 301 be phase-matched to the lower DBR 121. Accordingly, the dielectric layer 301 may help to prevent the subsequently formed metal layer 111 from undesirably alloying with the lower DBR 121 when the carrier substrate 101 is bonded to the layered stack formed on the growth substrate 201 and during other subsequent high temperature processing steps. Such alloying of the metal layer 111 with the lower DBR 121 may lower the composite reflectance of the composite mirror structure. According to the present aspect of the invention, the mechanical bonding strength between the lower DBR 121 and the dielectric layer 301 and between the dielectric layer 301 and the metal layer 111 should be strong enough to provide acceptable structural integrity during fabrication and over the operational lifetime of the device.

As will be appreciated, when viewed together, the dielectric layer 301 and the optional phase shift layer 151 described above with respect to FIG. 3 may provide an overall phase shifting effect. However, phase shift layer 151 is still regarded and referred to as the phase shift layer for the VCSEL because it has the predominant phase shifting effect and is dedicated to this function. Thus, the design of the optional phase shift layer 151 should take into account the presence of the dielectric layer 301. In one aspect of the present invention, the dielectric layer 301 and the phase shift layer 151 may be combined into a single layer providing both phase shifting and reaction barrier functions.

FIGS. 5A-5D illustrate a vertical cavity surface emitting laser (VCSEL) structure in accordance with principles of a fourth aspect of the present invention.

Figure 5A:
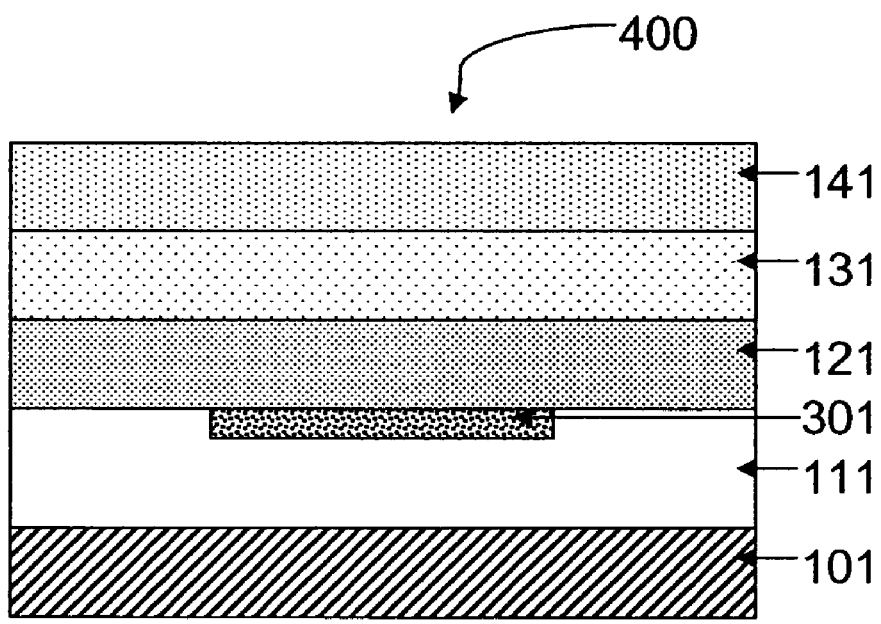
FIGS. 5A-5D illustrate a vertical cavity surface emitting laser (VCSEL) in accordance with principles of a fourth aspect of the present invention.
Figure 5B:
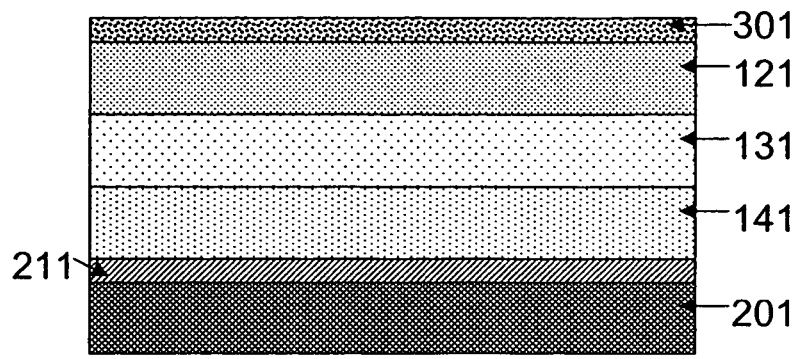
Figure 5C:
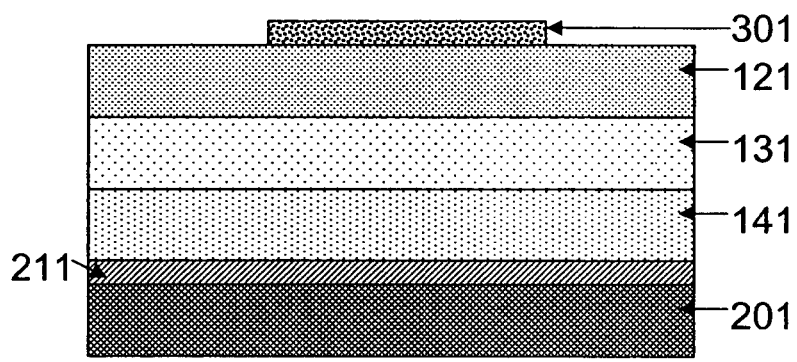
Figure 5D:
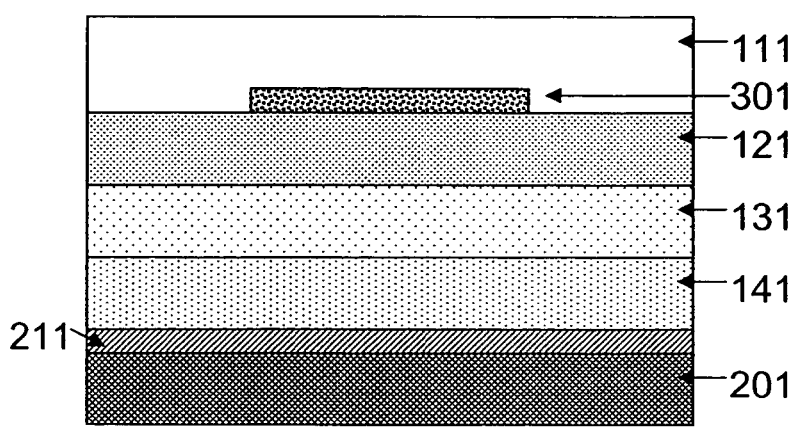

Referring to FIG. 5A, a VCSEL structure 400 may, for example, be fabricated in substantially the same manner as VCSEL structure 300, shown in FIG. 4. However, after the dielectric layer 301 is formed on the lower DBR 121 (as shown in FIG. 5B), the dielectric layer 301 may be patterned (as shown in FIG. 5C). In one aspect of the present invention, the dielectric layer 301 may be patterned to exist at least within an entirety of a subsequently formed VCSEL aperture through which light is emitted. Referring to FIG. 5D, the metal layer 111 is deposited over the patterned dielectric layer 301 and contacts portions of the lower DBR 121. Subsequently, the processing steps described above with respect to FIGS. 2C and 4 can be performed on the resultant layered stack. While the dielectric layer 301 shown in FIG. 4 provides minimal or no benefit to reflectivity of the composite mirror structure, it does reduce the thermally conductive characteristics of the composite mirror structure. Accordingly, patterning the dielectric layer 301 as shown in FIGS. 5A-5D enhances the thermally conductive characteristics of the composite mirror structure and preserves the high composite reflectance values described above. Further, allowing the metal layer 111 to directly contact the lower DBR 121 eliminates the need for intracavity contacts, which the design shown in FIG. 4 would require.

Figure 6A:
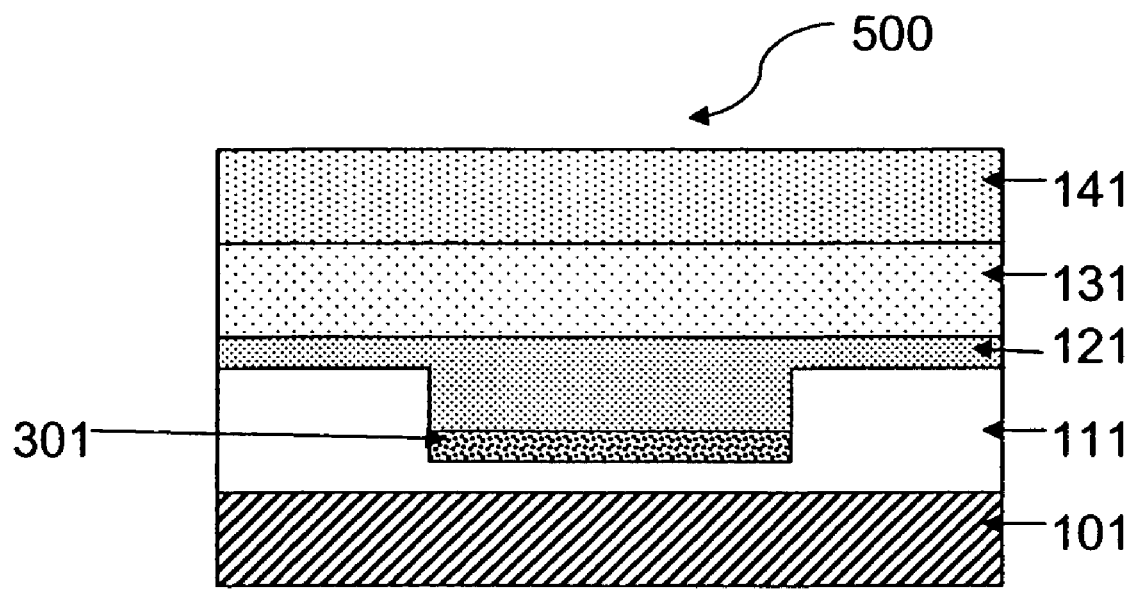
FIGS. 6A-6C illustrate a vertical cavity surface emitting laser (VCSEL) in accordance with principles of a fifth aspect of the present invention.
Figure 6B:
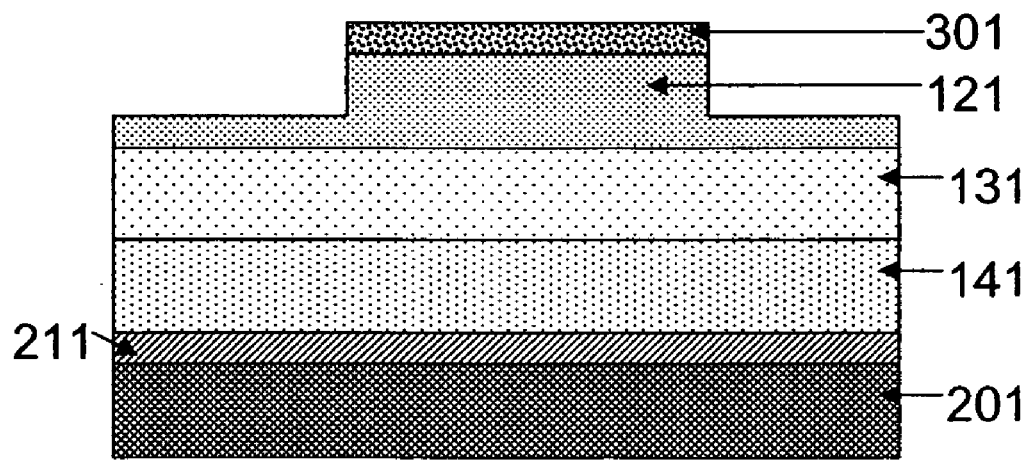
Figure 6C:
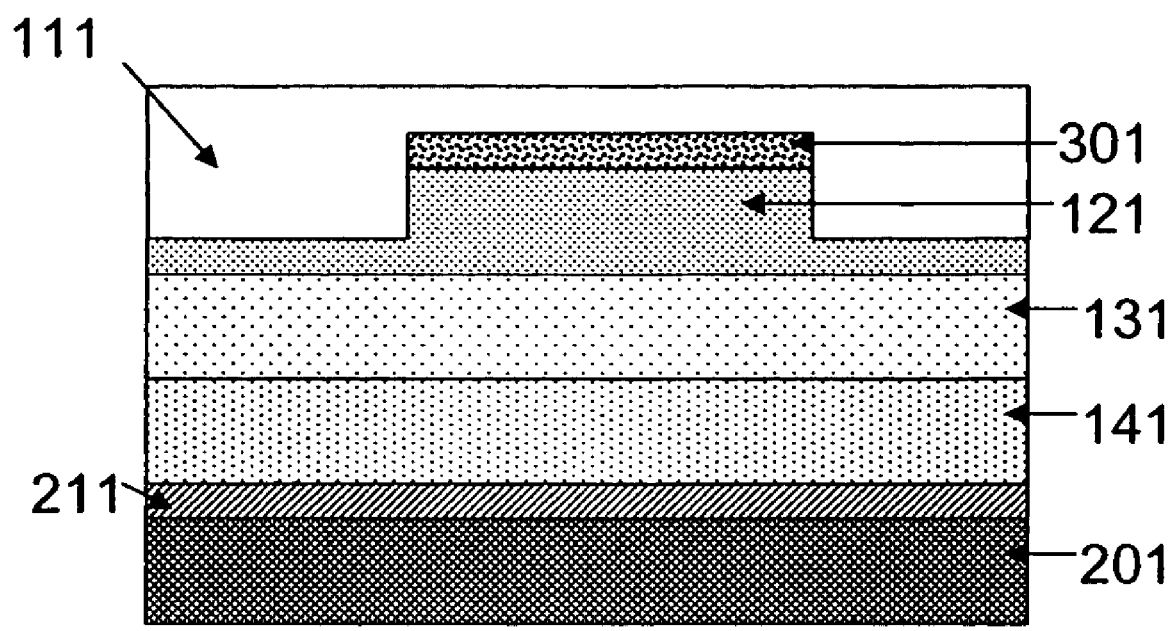

FIGS. 6A-6C illustrate a vertical cavity surface emitting laser (VCSEL) structure in accordance with principles of a fifth aspect of the present invention.

Referring to FIG. 6A, a VCSEL structure 500 may, for example, be fabricated in substantially the same manner as VCSEL structure 400, shown in FIG. 5A. However, after the dielectric layer 301 is patterned (as shown above in FIG. 5C), the lower DBR 121 may be patterned (as shown in FIG. 6B). In one aspect of the present invention, a first (e.g., peripheral) portion of the lower DBR 121, corresponding to the portion of the lower DBR axially surrounding the subsequently formed VCSEL aperture, may be etched while leaving a second (e.g., central) portion of the lower DBR 121, corresponding to the portion of the lower DBR 121 within the subsequently formed VCSEL aperture, unpatterned (e.g., unetched). Although not shown, the entire thickness of the lower DBR 121 may be etched such that the subsequently formed metal layer 111 directly contacts the active region 131. Referring to FIG. 6C, metal layer 111 is deposited over the patterned dielectric layer 301 and over the patterned lower DBR 121. Subsequently, the processing steps described above with respect to FIGS. 2C and 4 can be performed on the resultant layered stack. By etching the lower DBR as described above, the metal layer 111 may be brought extremely close to the active region 131, thereby enhancing the electrically and thermally conductive characteristics of the VCSEL 500.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A vertical cavity surface emitting laser (VCSEL) structure, comprising:
    a metal layer arranged on a carrier substrate;
    a dielectric layer arranged on the metal layer;
    a lower semiconductor distributed Bragg reflector (DBR) arranged on the dielectric layer, wherein the lower semiconductor DBR contacts a portion of the metal layer and wherein the metal layer and the lower semiconductor DBR provide sufficient reflectivity to the VCSEL; and
    an active region arranged on the lower semiconductor DBR.

2. The VCSEL structure of claim 1, further comprising an upper reflector arranged on the active region.

3. The VCSEL structure of claim 1, wherein the lower DBR includes
    a first portion having a first thickness; and
    a second portion having a second thickness, wherein the first thickness is greater than the second thickness.

4. The VCSEL structure of claim 3, wherein the second portion surrounds the first portion.

5. The VCSEL structure of claim 1, wherein a thickness of the dielectric layer is less than or equal to about one-half of a wavelength at which the active region lases.

6. The VCSEL structure of claim 1, wherein the carrier substrate includes silicon.

7. The VCSEL structure of claim 1, wherein the metal layer includes a metal mirror sub-layer adjacent the dielectric layer.

8. The VCSEL structure of claim 7, wherein the metal mirror sub-layer includes at least one metal selected from the group consisting of gold, silver, copper, aluminum and combinations thereof.

9. The VCSEL structure of claim 1, wherein the metal layer includes a metal bonding sub-layer adjacent the carrier substrate.

10. The VCSEL structure of claim 9, wherein the metal bonding sub-layer includes at least one metal selected from the group consisting of gold, silver, copper, aluminum, indium, zinc and combinations thereof.

11. The VCSEL structure of claim 1, wherein the metal layer includes a metal reaction barrier sub-layer.

12. The VCSEL structure of claim 11, wherein the metal reaction barrier sub-layer includes at least one metal selected from the group consisting of titanium, tungsten, platinum and combinations thereof.

13. A vertical cavity surface emitting laser (VCSEL) comprising:
    a metal layer having a first sub-layer and a second sub-layer, the second sub-layer having a melting point that allows the metal layer to bond to a carrier substrate;
    a single dielectric layer arranged on the first sub-layer;
    a lower semiconductor distributed Bragg reflector (DBR) arranged on the dielectric layer, wherein the lower semiconductor DBR contacts a portion of the metal layer;
    an active region arranged on the lower semiconductor DBR;
    wherein the second sub-layer has a melting point that enables the metal layer to bond to a carrier without substantially degrading the lower semiconductor DBR and wherein the single dielectric layer substantially prevents the metal layer from alloying the lower semiconductor DBR at least during formation of the metal layer.

* * * * *